(12) United States Patent
Liao et al.

(10) Patent No.: US 11,574,967 B2
(45) Date of Patent: Feb. 7, 2023

(54) ORGANIC LIGHT-EMITTING DISPLAY PANEL

(71) Applicant: Novatek Microelectronics Corp., Hsinchu (TW)

(72) Inventors: Po-Sheng Liao, Hsinchu (TW); Chang-Hung Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 17/120,260

(22) Filed: Dec. 14, 2020

(65) Prior Publication Data

US 2022/0052123 A1    Feb. 17, 2022

Related U.S. Application Data

(60) Provisional application No. 63/065,513, filed on Aug. 14, 2020.

(51) Int. Cl.
*G09G 5/00*    (2006.01)
*H01L 27/32*   (2006.01)
*H01L 51/52*   (2006.01)

(52) U.S. Cl.
CPC ........ *H01L 27/323* (2013.01); *H01L 51/5253* (2013.01); *H01L 51/5284* (2013.01)

(58) Field of Classification Search
CPC .............. H01L 27/323; H01L 27/3272; H01L 27/3276; H01L 51/5206; H01L 51/5221; H01L 51/5246; H01L 2227/323; G06F 3/044; G06F 2203/04102; G06F 3/0412; G09G 3/3275; G09G 3/3266

USPC .......................................................... 345/173
See application file for complete search history.

(56) References Cited

U.S. PATENT DOCUMENTS

| | | | |
|---|---|---|---|
| 10,802,626 B2 | 10/2020 | Jeong et al. | |
| 10,971,562 B2* | 4/2021 | Lee | G06F 3/0443 |
| 2018/0166507 A1* | 6/2018 | Hwang | G06F 3/041 |
| 2019/0377445 A1 | 12/2019 | Jeong et al. | |
| 2020/0004368 A1* | 1/2020 | Kim | G06F 3/0446 |
| 2020/0301477 A1* | 9/2020 | Bouthinon | G06F 1/1656 |
| 2020/0350385 A1* | 11/2020 | Wang | H01L 51/5237 |
| 2021/0004110 A1 | 1/2021 | Jeong et al. | |
| 2021/0050534 A1* | 2/2021 | Yang | H01L 51/003 |
| 2021/0325931 A1* | 10/2021 | Ha | H04M 1/0266 |

FOREIGN PATENT DOCUMENTS

| | | |
|---|---|---|
| TW | 201519432 | 5/2015 |
| TW | 201525788 | 7/2015 |
| TW | 202013162 | 4/2020 |

OTHER PUBLICATIONS

"Office Action of Taiwan Counterpart Application", dated Aug. 5, 2021, p. 1-p. 7.

* cited by examiner

*Primary Examiner* — Jennifer T Nguyen
(74) *Attorney, Agent, or Firm* — JCIPRNET

(57) ABSTRACT

An organic light-emitting display (OLED) panel, including an OLED layer, a touch sensing layer, and a shielding layer, is provided. The OLED layer is suitable for displaying an image. The touch sensing layer is suitable for sensing a touch event of the OLED panel. The shielding layer is disposed between the OLED layer and the touch sensing layer. The shielding layer is suitable for blocking a mutual interference between the OLED layer and the touch sensing layer.

12 Claims, 8 Drawing Sheets

ORGANIC LIGHT-EMITTING DISPLAY PANEL

CROSS-REFERENCE TO RELATED APPLICATION

This application claims the priority benefit of U.S. provisional application Ser. No. 63/065,513, filed on Aug. 14, 2020. The entirety of the above-mentioned patent application is hereby incorporated by reference herein and made a part of this specification.

BACKGROUND

Technical Field

The disclosure relates to a display device, and particularly relates to an organic light-emitting display (OLED) panel.

Description of Related Art

The touch and display driver integration (TDDI) chip adopts a time-sharing driving method to drive a liquid crystal display (LCD) panel. That is, when the TDDI chip performs a display driving operation on the LCD panel, the touch sensing operation is suspended; and when the TDDI chip performs a touch sensing operation on the LCD panel, the display driving operation is suspended.

The driving method of the OLED panel is different from the driving method of the LCD panel. The display driving operation of a display frame of the OLED panel includes a reset phase, a data writing phase, and an emission phase. When the TDDI chip of the OLED panel adopts the same time-sharing driving method as that of the LCD panel, the operation of the emission phase will be suspended, thus causing the issue of bright and dark bands. Therefore, the time-sharing driving operation of the LCD panel cannot be simply applied to the OLED panel. The current TDDI chip of the OLED panel adopts the operation method of "simultaneous display driving operation and touch sensing operation". However, such operation method may cause display multi-band, gate driver in panel (GIP) output signal glitch, touch malfunction, and/or other issues.

In order to reduce the fan-out impedance, the display driving pins and the touch sensing pins (such as RX/TX pins) of the TDDI chip of the OLED panel are arranged in interleaving groups on the chip. For example, the multiple pins on one side of the TDDI chip are sequentially: 80 touch sensing pins, 256 display driving pins, 80 touch sensing pins, 256 display driving pins, . . . . In the case where the TDDI chip of the OLED panel adopts the operation method of "simultaneous display driving operation and touch sensing operation", the display driving pins (circuit) are easily interfered by adjacent touch sensing pins (circuit) or are interfered due to RX/TX fanout overlap. When the display driving pins (circuit) are coupled to a high voltage higher than the target potential by the touch sensing pins (circuit), since the OLED pixel circuit adopts the property of diode connect for compensation, the voltage of the OLED pixel circuit (the voltage of the display driving pins) cannot be pulled back to the target potential, so that color shift occurs and causes the phenomenon of multi-band.

The driving time of the display driving pins (circuit) of the TDDI chip of the OLED panel overlaps with the driving time of the touch sensing pins (circuit). At this time, the GIP clock signal is coupled with the touch sensing pins (circuit) (due to the overlap of the touch sensing signal and the GIP clock signal). When the signal of the touch sensing pins (circuit) is coupled to the GIP clock signal, the GIP output signal glitch occurs.

The brightness change of the OLED will cause the phenomenon of voltage (IR) drop in the cathode voltage of the OLED pixel circuit. Since the cathode voltage of the active area (AA) of the OLED panel overlaps with the signal of the touch sensing pins (circuit), the phenomenon of IR drop will cause the potential change of the touch sensing signal, thereby causing the touch malfunction.

It should be noted that the content of the "Description of Related Art" section is used to help understand the disclosure. Part of the content (or all of the content) disclosed in the "Description of Related Art" section may not be the conventional technology known to persons skilled in the art. The content disclosed in the "Description of Related Art" section does not represent that the content is already known to persons skilled in the art before the application of the disclosure.

SUMMARY

The disclosure provides an organic light-emitting display (OLED) panel to prevent mutual interference between an OLED layer and a touch sensing layer as much as possible.

In an embodiment of the disclosure, an OLED panel includes an OLED layer, a touch sensing layer, and a first shielding layer. The OLED layer is suitable for displaying an image. The touch sensing layer is suitable for sensing a touch event of the OLED panel. The first shielding layer is disposed between the OLED layer and the touch sensing layer. The first shielding layer is suitable for blocking the mutual interference between the OLED layer and the touch sensing layer.

Based on the above, the OLED panel according to the embodiments of the disclosure has the first shielding layer. In some embodiments, the first shielding layer may be electrically floating or connected to a reference voltage (a ground voltage or other direct current (DC) voltages) to block the mutual interference between the OLED layer and the touch sensing layer as much as possible.

In order for the features and advantages of the disclosure to be more comprehensible, specific embodiments are described in detail below in conjunction with the accompanying drawings.

DETAILED DESCRIPTION OF DISCLOSED EMBODIMENTS

Figure 1:
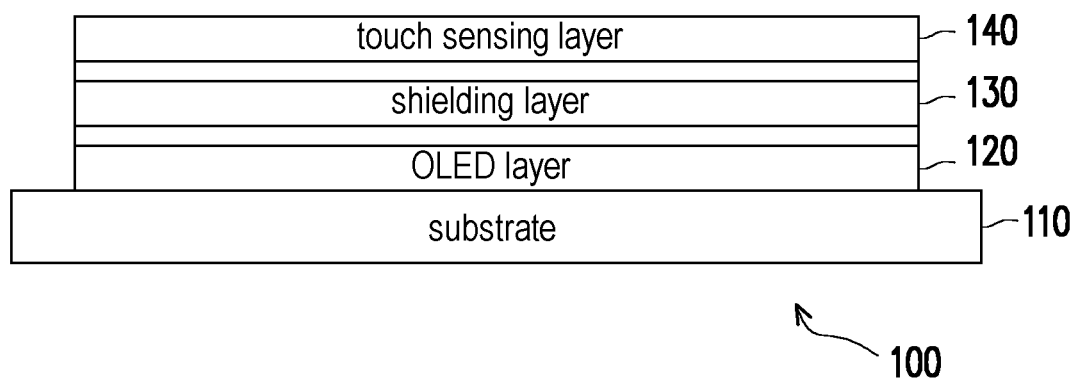
FIG. 1 is a schematic cross-sectional view of an organic light-emitting display (OLED) panel according to an embodiment of the disclosure.

The term "coupling (or connection)" used in the entire specification (including the claims) of the present application may refer to any direct or indirect connection means. For example, if a first device is described as being coupled (or connected) to a second device, it should be interpreted that the first device may be directly connected to the second device or the first device may be indirectly connected to the second device through another device or certain connection means. Terms such as "first", "second", etc. mentioned in the entire specification (including the claims) of the present application are used to name the elements or to distinguish between different embodiments or ranges, but not to limit the upper limit or lower limit of the number of elements. In addition, wherever possible, elements/components/steps using the same reference numerals in the drawings and embodiments represent the same or similar parts. Relevant descriptions in different embodiments may be made with reference to each other for elements/components/steps using the same reference numerals or using the same terminologies.

FIG. 1 is a schematic cross-sectional view of an organic light-emitting display (OLED) panel 100 according to an embodiment of the disclosure. The OLED panel 100 shown in FIG. 1 includes a substrate 110, an OLED layer 120, a shielding layer 130, and a touch sensing layer 140. According to design requirements, the material of the substrate 110 may be glass or other transparent materials. The OLED layer 120 may be disposed on the substrate 110. Based on the display driving operation of a display driving circuit (not shown in FIG. 1, such as a touch and display driver integration (TDDI) chip or other circuits), the OLED layer 120 may display an image. The embodiment does not limit the specific structure and implementation method of the OLED layer 120. According to design requirements, in some embodiments, the OLED layer 120 may include the structure of a conventional OLED panel or other structures.

The touch sensing layer 140 may be disposed on the OLED layer 120. Based on the touch sensing operation of a touch sensing driving circuit (not shown in FIG. 1, such as a TDDI chip or other circuits), the touch sensing layer 140 may sense a touch event of the OLED panel 100. The embodiment does not limit the specific structure and implementation method of the touch sensing layer 140. According to design requirements, in some embodiments, the touch sensing layer 140 may include the structure of a conventional touch panel (or a touch display panel) or other structures.

When the driving circuit (not shown in FIG. 1, such as a TDDI chip or other circuit) adopts the operation method of "simultaneous display driving operation and touch sensing operation" on the OLED panel 100, the display driving operation of the OLED layer 120 may interfere with the touch sensing operation of the touch sensing layer 140, and/or the touch sensing operation of the touch sensing layer 140 may interfere with the display driving operation of the OLED layer 120. In the embodiment shown in FIG. 1, the shielding layer 130 is disposed between the OLED layer 120 and the touch sensing layer 140. For example (but not limited thereto), a dummy layer may be inserted between the OLED layer 120 and the touch sensing layer 140 to serve as the shielding layer 130. The shielding layer 130 may block the mutual interference between the OLED layer 120 and the touch sensing layer 140 to improve the phenomenon of gate driver in panel (GIP) output signal glitch.

According to design requirements, the material of the shielding layer 130 may be any conductive material. In some embodiments, the material of the shielding layer 130 may be a transparent conductive material, such as indium tin oxide (no) or other transparent conductive materials. In other embodiments, the material of the shielding layer 130 may be an opaque conductive material, such as metal or other opaque conductive materials. In the case where the material of the shielding layer 130 is an opaque material, multiple micro-holes may be disposed in the shielding layer 130, so that the light emitted by the pixel circuit of the OLED layer 120 may pass through the shielding layer 130. According to design requirements, the shielding layer 130 may be electrically floating or electrically connected to a reference voltage. According to design requirements, the reference voltage may be any fixed voltage, such as a ground voltage or other direct current (DC) voltages.

Figure 2A:
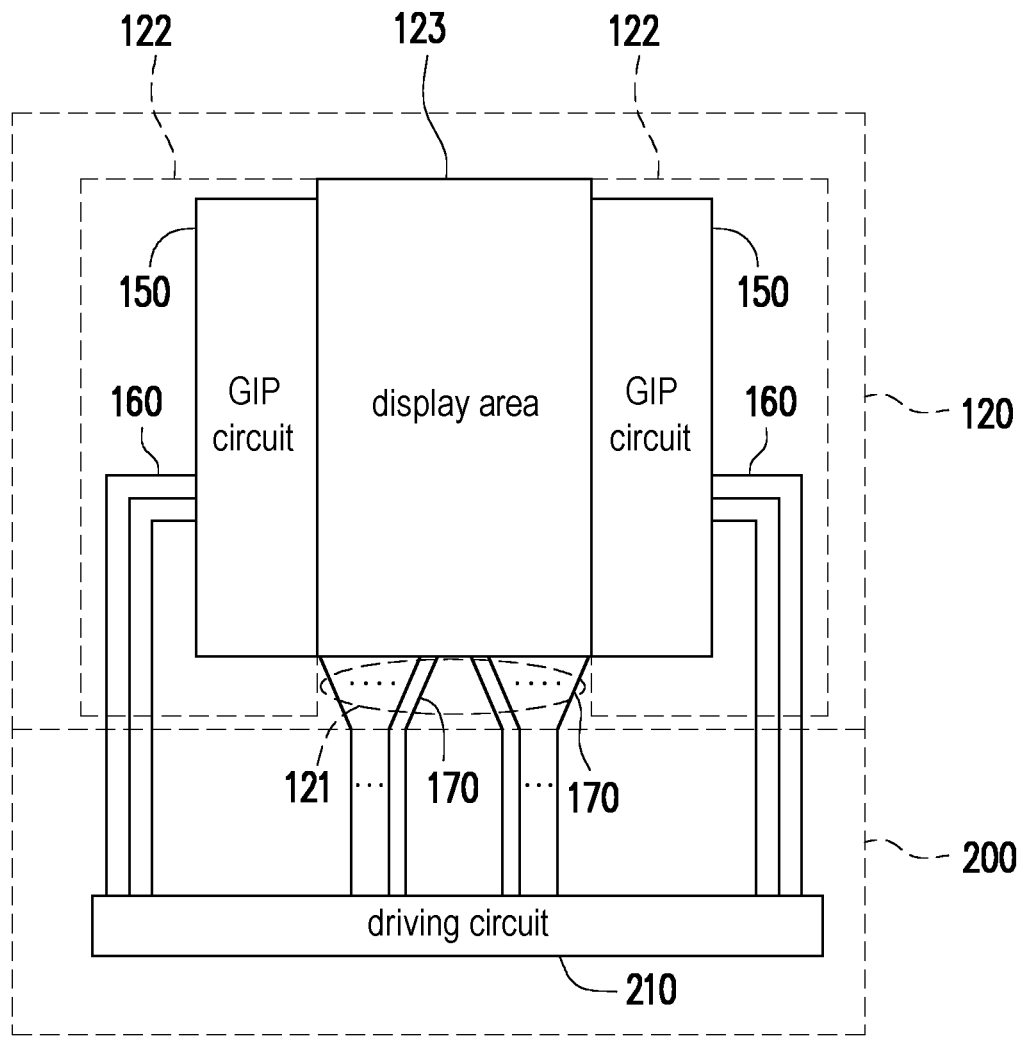
FIG. 2A is a schematic top view illustrating an OLED layer shown in FIG. 1 according to an embodiment of the disclosure.

FIG. 2A is a schematic top view illustrating the OLED layer 120 shown in FIG. 1 according to an embodiment of the disclosure. In the embodiment shown in FIG. 2A, a driving circuit 210 disposed on a flexible printed circuit (FPC) substrate 200 may perform a display driving operation on the OLED layer 120 of the OLED panel 100. According to design requirements, the driving circuit 210 shown in FIG. 2A may include a TDDI chip or other circuits.

The OLED layer 120 (the OLED panel 100) shown in FIG. 2A may be at least divided into a display driving line fan-out area 121, a GIP signal line area 122, and a display area 123. Multiple display driving lines 170 are disposed in the display driving line fan-out area 121. A GIP circuit 150 and multiple GIP signal lines 160 are disposed in the GIP signal line area 122. The pixel matrix (not shown) of the OLED panel 100 is disposed in the display area 123.

Figure 2B:
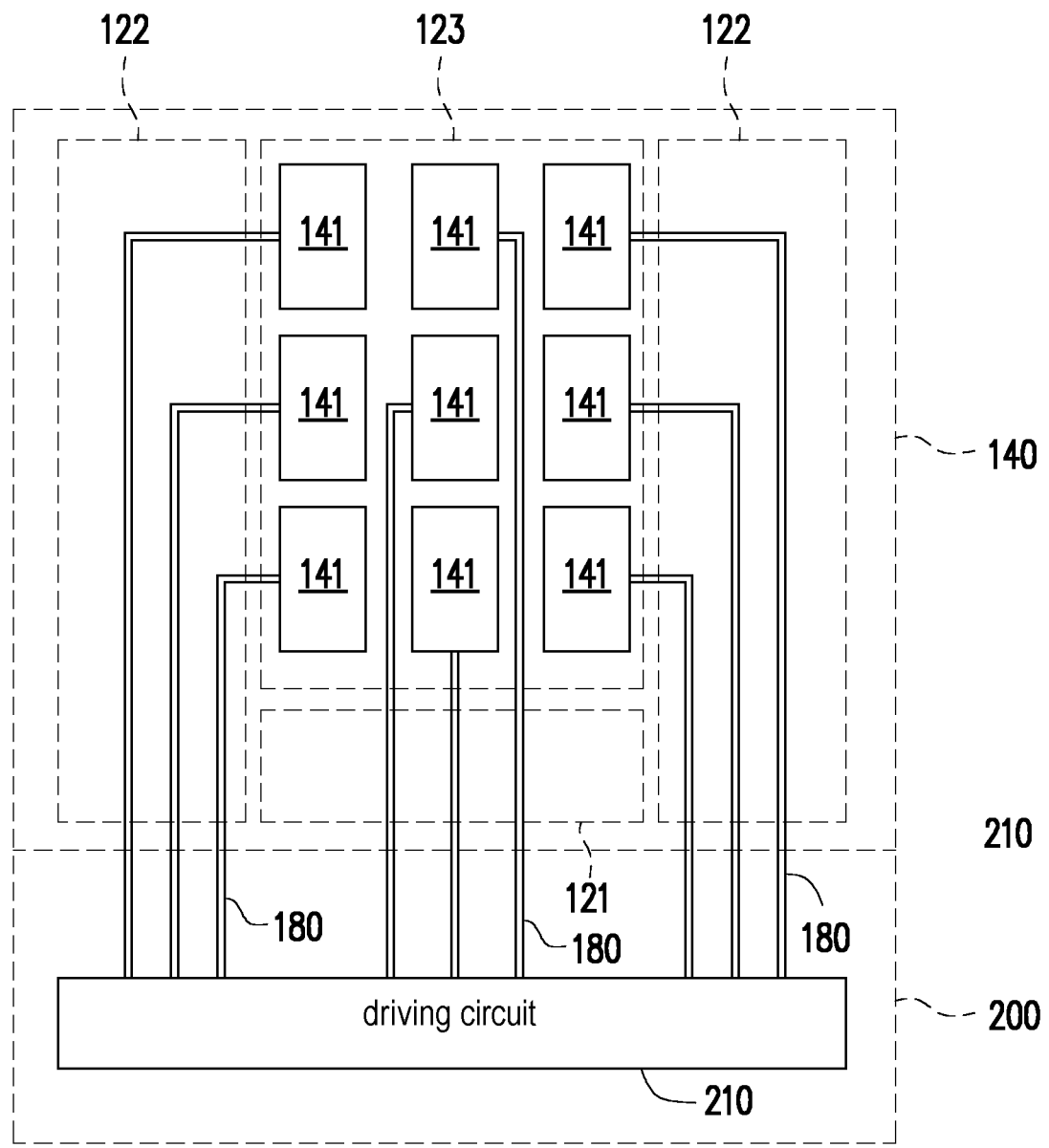
FIG. 2B is a schematic top view illustrating a touch sensing layer shown in FIG. 1 according to an embodiment of the disclosure.

FIG. 2B is a schematic top view illustrating the touch sensing layer 140 shown in FIG. 1 according to an embodiment of the disclosure. In the embodiment shown in FIG. 2B, the driving circuit 210 disposed on the FPC substrate 200 may perform a touch sensing operation on the touch sensing layer 140 of the OLED panel 100. According to design requirements, the driving circuit 210 shown in FIG. 2B may include a TDDI chip or other circuits.

The touch sensing layer 140 (the OLED panel 100) shown in FIG. 2B may be at least divided into the display driving line fan-out area 121, the GIP signal line area 122, and the display area 123. Multiple sensing lines 180 are disposed in the display driving line fan-out area 121 and the GIP signal line area 122. Multiple sensing electrodes 141 are disposed in the display area 123. The driving circuit 210 may perform the touch sensing operation on the sensing electrodes 141 through the sensing lines 180.

Figure 3:
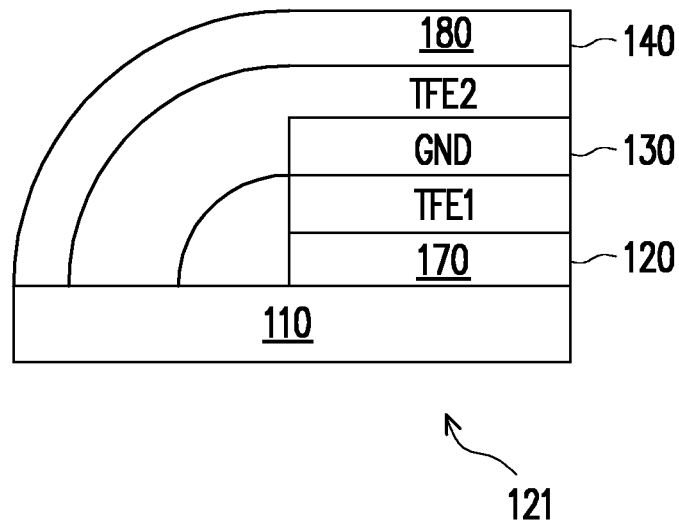
FIG. 3 is a schematic cross-sectional view illustrating a partial region of a display driving line fan-out area shown in FIG. 2A and FIG. 2B according to an embodiment of the disclosure.

FIG. 3 is a schematic cross-sectional view illustrating a partial region of the display driving line fan-out area 121 shown in FIG. 2A and FIG. 2B according to an embodiment of the disclosure. In the display driving line fan-out area 121 of the OLED panel 100, the display driving lines 170 of the OLED layer 120 may be disposed on the substrate 110. The shielding layer 130 covers the display driving lines 170 (the OLED layer 120). In the embodiment shown in FIG. 3, the shielding layer 130 may be connected to a ground voltage GND (a reference voltage). In other embodiments, the shielding layer 130 shown in FIG. 3 may be electrically connected to other DC voltages (reference voltages). In other embodiments, the shielding layer 130 shown in FIG. 3 may be electrically floating. The touch sensing layer 140 (the sensing lines 180) covers the shielding layer 130.

A thin film encapsulation layer TFE1 is disposed between the shielding layer 130 and the OLED layer 120. The thin film encapsulation layer TFE2 is disposed between the shielding layer 130 and the touch sensing layer 140. According to design requirements, the thin film encapsulation layer TFE1 and/or a thin film encapsulation layer TFE2 may be conventional thin film encapsulation layers or other thin film encapsulation layers.

Figure 4:
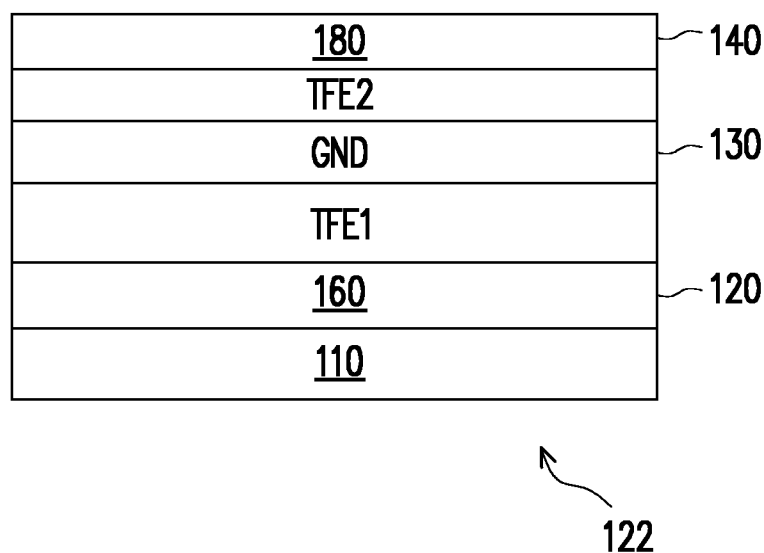
FIG. 4 is a schematic cross-sectional view illustrating a partial region of a gate driver in panel (GIP) signal line area shown in FIG. 2A and FIG. 2B according to an embodiment of the disclosure.

FIG. 4 is a schematic cross-sectional view illustrating a partial region of the GIP signal line area 122 shown in FIG. 2A and FIG. 2B according to an embodiment of the disclosure. In the GIP signal line area 122 of the OLED panel 100, the GIP signal lines 160 of the OLED layer 120 may be disposed on the substrate 110. The shielding layer 130 covers the GIP signal lines 160 (the OLED layer 120). Please refer to the relevant descriptions of the substrate 110, the OLED layer 120, the thin film encapsulation layer TFE1, the shielding layer 130, the thin film encapsulation layer TFE2, and the touch sensing layer 140 shown in FIG. 3 for the descriptions of the substrate 110, the OLED layer 120, the thin film encapsulation layer TFE1, the shielding layer 130, the thin film encapsulation layer TFE2, and the touch sensing layer 140 shown in FIG. 4, which will not be reiterated.

Figure 5:
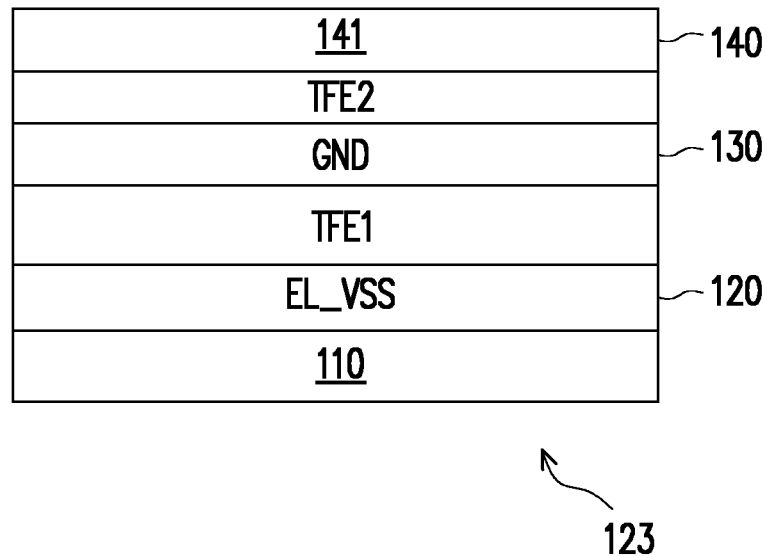
FIG. 5 is a schematic cross-sectional view illustrating a partial region of a display area shown in FIG. 2A and FIG. 2B according to an embodiment of the disclosure.

FIG. 5 is a schematic cross-sectional view illustrating a partial region of the display area 123 shown in FIG. 2A and FIG. 2B according to an embodiment of the disclosure. In the display area 123 of the OLED panel 100, the OLED layer 120 includes multiple common electrodes (not shown), and the touch sensing layer 140 includes the multiple sensing electrodes 141. The common electrodes may be coupled to a cathode of an organic light-emitting diode (not shown) of the pixel matrix of the OLED panel 100. In the embodiment shown in FIG. 5, the common electrodes may be connected to a cathode voltage EL_VSS (a reference voltage). The common electrodes of the OLED layer 120 may be disposed on the substrate 110. The shielding layer 130 covers the common electrodes (the OLED layer 120). The sensing electrodes 141 are disposed on the shielding layer 130. Please refer to the relevant descriptions of the substrate 110, the OLED layer 120, the thin film encapsulation layer TFE1, the shielding layer 130, the thin film encapsulation layer TFE2, and the touch sensing layer 140 shown in FIG. 3 for the descriptions of the substrate 110, the OLED layer 120, the thin film encapsulation layer TFE1, the shielding layer 130, the thin film encapsulation layer TFE2, and the touch sensing layer 140 shown in FIG. 5, which will not be reiterated.

Figure 6:
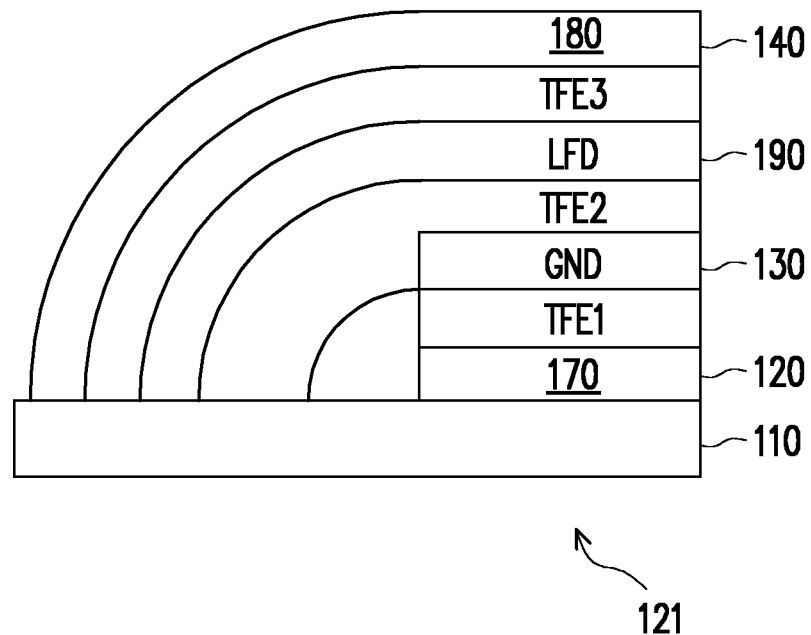
FIG. 6 is a schematic cross-sectional view illustrating a partial region of a display driving line fan-out area shown in FIG. 2A and FIG. 2B according to another embodiment of the disclosure.

FIG. 6 is a schematic cross-sectional view illustrating a partial region of a display driving line fan-out area 121 shown in FIG. 2A and FIG. 2B according to another embodiment of the disclosure. Compared with the embodiment shown in FIG. 3, the differences are that a shielding layer 190 and a thin film encapsulation layer TFE3 are added to the display driving line fan-out area 121 (the OLED panel) shown in FIG. 6. Please refer to the relevant descriptions of the substrate 110, the OLED layer 120, the thin film encapsulation layer TFE1, the shielding layer 130, the thin film encapsulation layer TFE2, and the touch sensing layer 140 shown in FIG. 3 for the descriptions of the substrate 110, the OLED layer 120, the thin film encapsulation layer TFE1, the shielding layer 130, the thin film encapsulation layer TFE2, and the touch sensing layer 140 shown in FIG. 6, which will not be reiterated.

The shielding layer 190 shown in FIG. 6 is disposed between the shielding layer 130 and the touch sensing layer 140. The shielding layer 130 covers the display driving lines 170 of the OLED layer 120. The shielding layer 190 covers the shielding layer 130 and the substrate 110. The touch sensing layer 140 covers the shielding layer 190. The thin film encapsulation layer TFE2 is disposed between the shielding layer 130 and the shielding layer 190, and the thin film encapsulation layer TFE3 is disposed between the shielding layer 190 and the touch sensing layer 140. According to the design requirements, the thin film encapsulation layer TFE3 may be a conventional thin film encapsulation layer or other thin film encapsulation layers. The shielding layer 190 may block the mutual interference between the OLED layer 120 and the touch sensing layer 140. According to design requirements, the material of the shielding layer 190 may be any conductive material. In the embodiment shown in FIG. 6, the shielding layer 190 may include a load free driving layer LFD. The load free driving is a conventional technology, so there will be no reiteration here.

Figure 7:
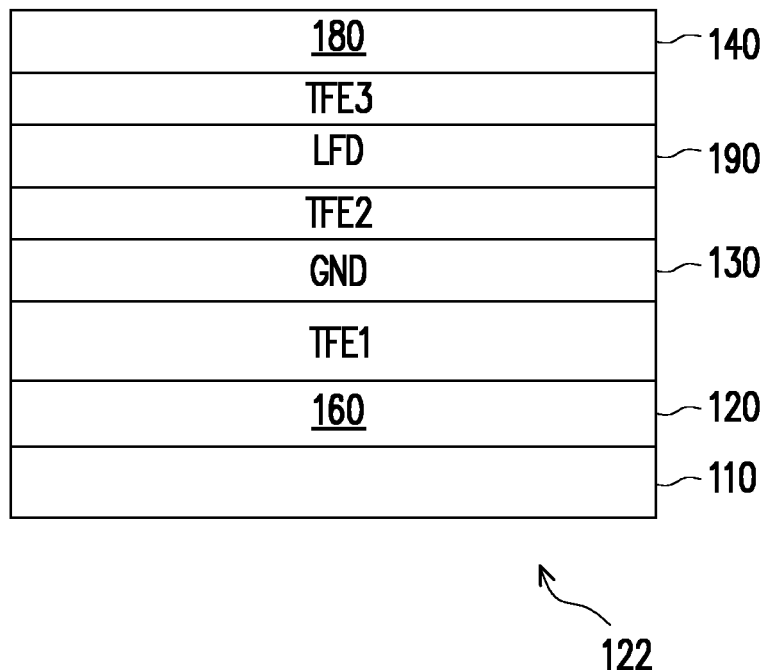
FIG. 7 is a schematic cross-sectional view illustrating a partial region of a GIP signal line area shown in FIG. 2A and FIG. 2B according to another embodiment of the disclosure.

FIG. 7 is a schematic cross-sectional view illustrating a partial region of the GIP signal line area 122 shown in FIG. 2A and FIG. 2B according to another embodiment of the disclosure. Compared with the embodiment shown in FIG. 4, the differences are that the shielding layer 190 and the thin film encapsulation layer TFE3 are added to the GIP signal line area 122 (the OLED panel) shown in FIG. 7. The shielding layer 130 covers the GIP signal lines 160 of the OLED layer 120, the shielding layer 190 covers the shielding layer 130, and the touch sensing layer 140 covers the shielding layer 190. Please refer to the relevant descriptions of the substrate 110, the OLED layer 120, the thin film encapsulation layer TFE1, the shielding layer 130, the thin film encapsulation layer TFE2, and the touch sensing layer 140 shown in FIG. 4 for the descriptions of the substrate 110, the OLED layer 120, the thin film encapsulation layer TFE1, the shielding layer 130, the thin film encapsulation layer TFE2, and the touch sensing layer 140 shown in FIG. 7, which will not be reiterated. Please refer to the relevant descriptions of the shielding layer 190 and the thin film encapsulation layer TFE3 shown in FIG. 6 to analogize the descriptions of the shielding layer 190 and the thin film encapsulation layer TFE3 shown in FIG. 7, which will not be reiterated.

Figure 8:
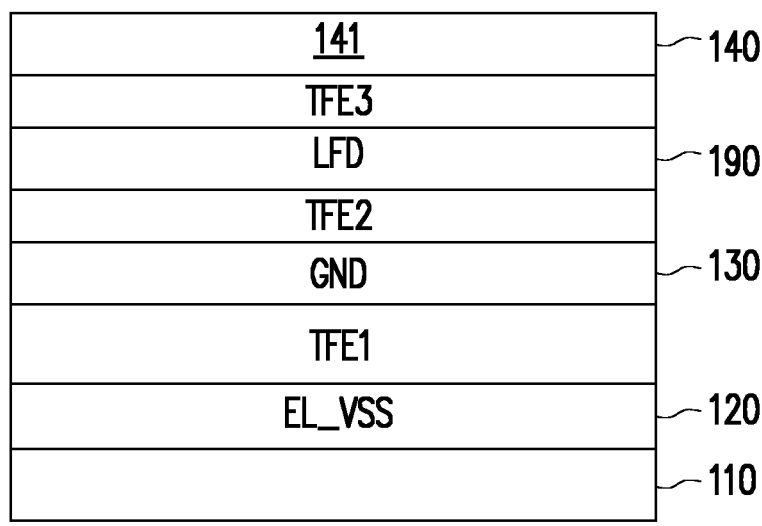
FIG. 8 is a schematic cross-sectional view illustrating a partial region of a display area shown in FIG. 2A and FIG. 2B according to another embodiment of the disclosure.

FIG. 8 is a schematic cross-sectional view illustrating a partial region of the display area 123 shown in FIG. 2A and FIG. 2B according to another embodiment of the disclosure. Compared with the embodiment shown in FIG. 5, the differences are that the shielding layer 190 and the thin film encapsulation layer TFE3 are added to the display area 123 (the OLED panel) shown in FIG. 8. The shielding layer 130 covers the common electrodes (not shown) of the OLED layer 120. In the embodiment shown in FIG. 8, the common electrodes may be connected to the cathode voltage EL_VSS (the reference voltage). The shielding layer 190 covers the shielding layer 130, and the sensing electrodes 141 of the touch sensing layer 140 are disposed on the shielding layer 190. Please refer to the relevant descriptions of the substrate 110, the OLED layer 120, the thin film encapsulation layer TFE1, the shielding layer 130, the thin film encapsulation layer TFE2, and the touch sensing layer 140 shown in FIG. 5 for the descriptions of the substrate 110, the OLED layer 120, the thin film encapsulation layer TFE1, the shielding layer 130, the thin film encapsulation layer TFE2, and the touch sensing layer 140 shown in FIG. 8, which will not be reiterated. Please refer to the relevant descriptions of the shielding layer 190 and the thin film encapsulation layer TFE3 shown in FIG. 6 to analogize the descriptions of the shielding layer 190 and the thin film encapsulation layer TFE3 shown in FIG. 8, which will not be reiterated.

In any case, the implementation method of the shielding layer 190 should not be limited to the embodiments shown in FIG. 6 to FIG. 8. For example, in some embodiments, a dummy layer may be inserted between the shielding layer 130 and the touch sensing layer 140 to serve as the shielding layer 190. According to design requirements, the material of the shielding layer 190 may be any conductive material. In some embodiments, the material of the shielding layer 190 may be a transparent conductive material, such as ITO or other transparent conductive materials. In other embodiments, the material of the shielding layer 190 may be an opaque conductive material, such as metal or other opaque conductive materials. In the case where the material of the shielding layer 190 is an opaque material, multiple micro-holes may be disposed in the shielding layer 190, so that the light emitted by the pixel circuit of the OLED layer 120 may pass through the shielding layer 190. According to design requirements, the shielding layer 190 may be electrically floating or electrically connected to a reference voltage. According to design requirements, the reference voltage may be any fixed voltage, such as the ground voltage GND or other DC voltages.

Figure 9:
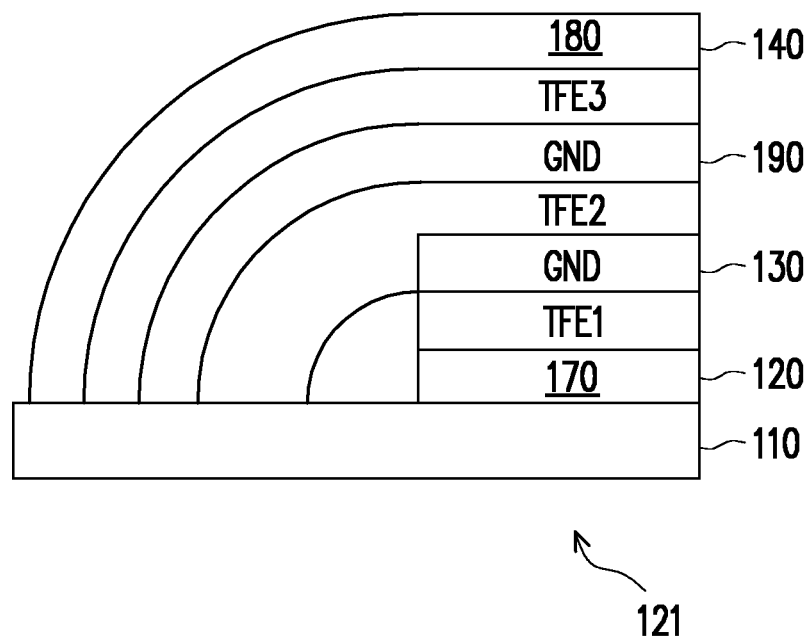
FIG. 9 is a schematic cross-sectional view illustrating a partial region of a display driving line fan-out area shown in FIG. 2A and FIG. 2B according to still another embodiment of the disclosure.

FIG. 9 is a schematic cross-sectional view illustrating a partial region of the display driving line fan-out area 121 shown in FIG. 2A and FIG. 2B according to still another embodiment of the disclosure. Please refer to the relevant descriptions of the substrate 110, the OLED layer 120, the thin film encapsulation layer TFE1, the shielding layer 130, the thin film encapsulation layer TFE2, the shielding layer 190, the thin film encapsulation layer TFE3, and the touch sensing layer 140 shown in FIG. 6 for the descriptions of the substrate 110, the OLED layer 120, the thin film encapsulation layer TFE1, the shielding layer 130, the thin film encapsulation layer TFE2, the shielding layer 190, the thin film encapsulation layer TFE3, and the touch sensing layer 140 shown in FIG. 9, which will not be reiterated. Compared with the embodiment shown in FIG. 6, the difference is that the shielding layer 190 shown in FIG. 9 may be connected to the ground voltage GND (the reference voltage). In other embodiments, the shielding layer 190 shown in FIG. 9 may be electrically connected to other DC voltages. In still other embodiments, the shielding layer 190 shown in FIG. 9 may be electrically floating.

Figure 10:
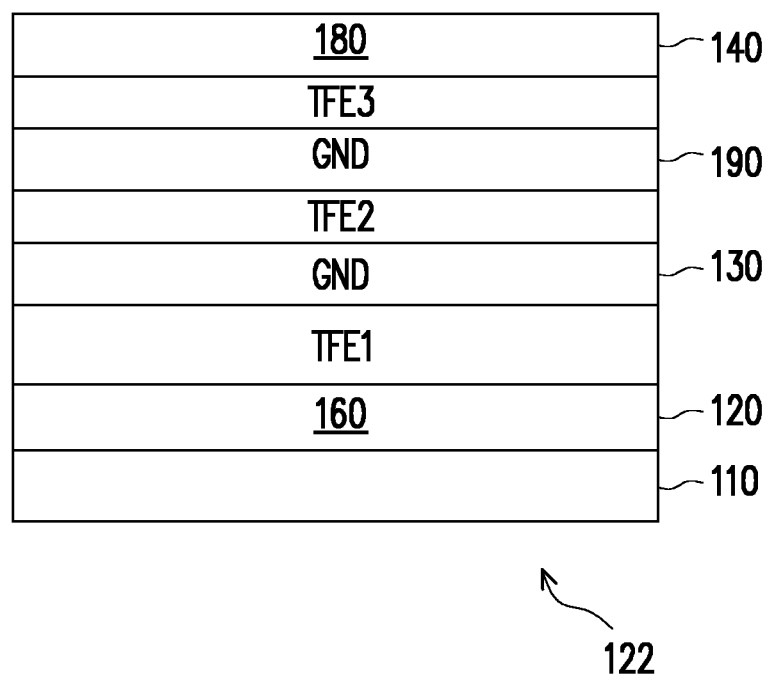
FIG. 10 is a schematic cross-sectional view illustrating a partial region of a GIP signal line area shown in FIG. 2A and FIG. 2B according to still another embodiment of the disclosure.

FIG. 10 is a schematic cross-sectional view illustrating a partial region of the GIP signal line area 122 shown in FIG. 2A and FIG. 2B according to still another embodiment of the disclosure. Please refer to the relevant descriptions of the substrate 110, the OLED layer 120, the thin film encapsulation layer TFE1, the shielding layer 130, the thin film encapsulation layer TFE2, the shielding layer 190, the thin film encapsulation layer TFE3, and the touch sensing layer 140 shown in FIG. 7 for the descriptions of the substrate 110, the OLED layer 120, the thin film encapsulation layer TFE1, the shielding layer 130, the thin film encapsulation layer TFE2, the shielding layer 190, the thin film encapsulation layer TFE3, and the touch sensing layer 140 shown in FIG. 10, which will not be reiterated. Compared with the embodiment shown in FIG. 7, the difference is that the shielding layer 190 shown in FIG. 10 is connected to the ground voltage GND (the reference voltage). In other embodiments, the shielding layer 190 shown in FIG. 10 may be electrically connected to other DC voltages. In still other embodiments, the shielding layer 190 shown in FIG. 10 may be electrically floating.

Figure 11:
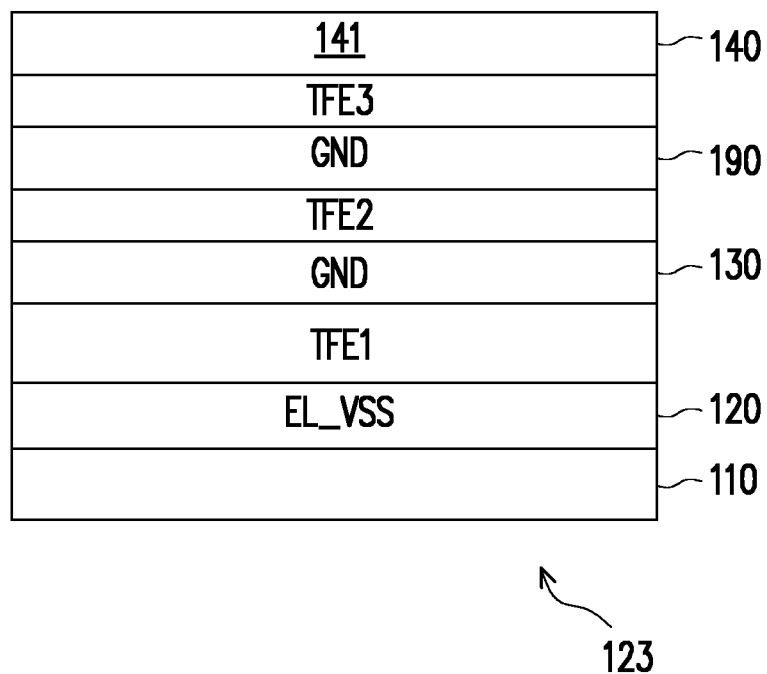
FIG. 11 is a schematic cross-sectional view illustrating a partial region of a display area shown in FIG. 2A and FIG. 2B according to still another embodiment of the disclosure.

FIG. 11 is a schematic cross-sectional view illustrating a partial region of the display area 123 shown in FIG. 2A and FIG. 2B according to still another embodiment of the disclosure. Please refer to the relevant descriptions of the substrate 110, the OLED layer 120, the thin film encapsulation layer TFE1, the shielding layer 130, the thin film encapsulation layer TFE2, the shielding layer 190, the thin film encapsulation layer TFE3, and the touch sensing layer 140 shown in FIG. 8 for the descriptions of the substrate 110, the OLED layer 120, the thin film encapsulation layer TFE1, the shielding layer 130, the thin film encapsulation layer TFE2, the shielding layer 190, the thin film encapsulation layer TFE3, and the touch sensing layer 140 shown in FIG. 11, which will not be reiterated. Compared with the embodiment shown in FIG. 8, the difference is that the shielding layer 190 shown in FIG. 11 is connected to the ground voltage GND (the reference voltage). In other embodiments, the shielding layer 190 shown in FIG. 11 may be electrically connected to other DC voltages (reference voltages). In still other embodiments, the shielding layer 190 shown in FIG. 11 may be electrically floating.

In summary, the OLED panel 100 according to the foregoing embodiments has at least the shielding layer 130. In some embodiments, the shielding layer 130 may be electrically floating or connected to the reference voltage (the ground voltage GND or other DC voltages) to block the mutual interference between the OLED layer and the touch sensing layer as much as possible. Therefore, the driving circuit 210 may simultaneously perform the display driving operation and the touch sensing operation on the OLED panel 100.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the scope of the appended claims.

What is claimed is:
1. An organic light-emitting display panel, comprising:
an organic light-emitting display layer, suitable for displaying an image;
a touch sensing layer, suitable for sensing a touch event of the organic light-emitting display panel;
a first shielding layer, disposed between the organic light-emitting display layer and the touch sensing layer, and suitable for blocking a mutual interference between the organic light-emitting display layer and the touch sensing layer, wherein the first shielding layer covers a gate driver in panel (GIP) circuit of the organic light-emitting display panel; and a second shielding layer, disposed between the first shielding layer and the touch sensing layer, wherein two opposite surfaces of the first shielding layer respectively contact with a first thin film encapsulation layer and a second thin film encapsulation layer, and two opposite surfaces of the second shielding layer respectively contact with the second thin film encapsulation layer and a third thin film encapsulation layer.

2. The organic light-emitting display panel according to claim 1, wherein the first shielding layer is suitable for electrically floating or being electrically connected to a reference voltage.

3. The organic light-emitting display panel according to claim 1, wherein the first thin film encapsulation layer is disposed between the first shielding layer and the organic light-emitting display layer; and the second thin film encapsulation layer is disposed between the first shielding layer and the touch sensing layer.

4. The organic light-emitting display panel according to claim 1, wherein in a display driving line fan-out area of the organic light-emitting display panel, the organic light-emitting display layer comprises a plurality of display driving lines, the plurality of display driving lines are disposed on a substrate, the first shielding layer covers the plurality of display driving lines, and the touch sensing layer covers the first shielding layer.

5. The organic light-emitting display panel according to claim 1, wherein in a gate driver in panel (GIP) signal line area of the organic light-emitting display panel, the organic light-emitting display layer comprises a plurality of GIP signal lines, the plurality of GIP signal lines are disposed on a substrate, the first shielding layer covers the plurality of GIP signal lines, and the touch sensing layer covers the first shielding layer.

6. The organic light-emitting display panel according to claim 1, wherein in a display area of the organic light-emitting display panel, the organic light-emitting display layer comprises a plurality of common electrodes, and the touch sensing layer comprises a plurality of sensing electrodes;

the plurality of common electrodes are disposed on a substrate;

the first shielding layer covers the plurality of common electrodes; and the plurality of sensing electrodes are disposed on the first shielding layer.

7. The organic light-emitting display panel according to claim 1, wherein the second shielding layer comprises a load free driving layer.

8. The organic light-emitting display panel according to claim 1, wherein the second shielding layer is suitable for electrically floating or being electrically connected to a reference voltage.

9. The organic light-emitting display panel according to claim 1, wherein the first thin film encapsulation layer is disposed between the first shielding layer and the organic light-emitting display layer;

the second thin film encapsulation layer is disposed between the first shielding layer and the second shielding layer; and the third thin film encapsulation layer is disposed between the second shielding layer and the touch sensing layer.

10. The organic light-emitting display panel according to claim 1, wherein in a display driving line fan-out area of the organic light-emitting display panel, the organic light-emitting display layer comprises a plurality of display driving lines, the plurality of display driving lines are disposed on a substrate, the first shielding layer covers the plurality of display driving lines, the second shielding layer covers the first shielding layer and the substrate, and the touch sensing layer covers the second shielding layer.

11. The organic light-emitting display panel according to claim 1, wherein in a GIP signal line area of the organic light-emitting display panel, the organic light-emitting display layer comprises a plurality of GIP signal lines, the plurality of GIP signal lines are disposed on a substrate, the first shielding layer covers the plurality of GIP signal lines, the second shielding layer covers the first shielding layer, and the touch sensing layer covers the second shielding layer.

12. The organic light-emitting display panel according to claim 1, wherein in a display area of the organic light-emitting display panel, the organic light-emitting display layer comprises a plurality of common electrodes, and the touch sensing layer comprises a plurality of sensing electrodes;

the plurality of common electrodes are disposed on a substrate;

the first shielding layer covers the plurality of common electrodes;

the second shielding layer covers the first shielding layer; and the plurality of sensing electrodes are disposed on the second shielding layer.

* * * * *